（12）United States Patent
Kato et al.

(10) Patent No.: US 12,368,030 B2
(45) Date of Patent: Jul. 22, 2025

(54) DEPOSITION METHOD AND DEPOSITION APPARATUS

(71) Applicant: Tokyo Electron Limited, Tokyo (JP)

(72) Inventors: Hitoshi Kato, Iwate (JP); Yu Wamura, Iwate (JP); Yuichiro Sase, Iwate (JP); Yuji Sawada, Yamanashi (JP); Hiroyuki Kikuchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 189 days.

(21) Appl. No.: 18/153,008

(22) Filed: Jan. 11, 2023

(65) Prior Publication Data

US 2023/0230817 A1    Jul. 20, 2023

(30) Foreign Application Priority Data

Jan. 14, 2022  (JP) ................................. 2022-004618

(51) Int. Cl.
| | |
|---|---|
| *C23C 16/458* | (2006.01) |
| *C23C 16/46* | (2006.01) |
| *C23C 16/503* | (2006.01) |
| *H01J 37/32* | (2006.01) |

(52) U.S. Cl.
CPC .... *H01J 37/32724* (2013.01); *C23C 16/4584* (2013.01); *C23C 16/46* (2013.01); *C23C 16/503* (2013.01); *H01J 37/3211* (2013.01); *H01J 37/3244* (2013.01); *H01J 37/32733* (2013.01); *H01J 2237/024* (2013.01); *H01J 2237/20214* (2013.01); *H01J 2237/3323* (2013.01)

(58) Field of Classification Search
CPC .................................................. C23C 16/4584
See application file for complete search history.

(56) References Cited

U.S. PATENT DOCUMENTS

| | | | |
|---|---|---|---|
| 2011/0039026 A1* | 2/2011 | Kato ..................... | C23C 16/402 118/730 |
| 2013/0087097 A1* | 4/2013 | Kato .................. | C23C 16/45544 118/719 |
| 2013/0276705 A1* | 10/2013 | Kato .................... | C23C 16/4584 118/725 |

(Continued)

FOREIGN PATENT DOCUMENTS

JP           2014-22653         2/2014

*Primary Examiner* — Cachet I Proctor
(74) *Attorney, Agent, or Firm* — IPUSA, PLLC

(57) ABSTRACT

A deposition apparatus including: a processing chamber; a rotary table provided in the processing chamber; a first processing region provided at a predetermined position in a circumferential direction of the rotary table; a second processing region provided downstream of the first processing region in the circumferential direction of the rotary table; a third processing region provided downstream of the second processing region in the circumferential direction of the rotary table; a first heater provided above the rotary table in the second processing region; and a plasma generator. The plasma generator includes: a protrusion having a longitudinally elongated shape in a planar view extending along a radius of the rotary table in a portion of an upper surface of the processing chamber, and protruding upward from the upper surface; and a coil wound along a side surface of the protrusion and has a longitudinally elongated shape in a planar view.

9 Claims, 8 Drawing Sheets

(56) References Cited

U.S. PATENT DOCUMENTS

| | | | | |
|---|---|---|---|---|
| 2014/0024200 A1* | 1/2014 | Kato | ............ | H01L 21/02274 |
| | | | | 118/723 R |
| 2014/0123895 A1* | 5/2014 | Kato | ............ | H01J 37/321 |
| | | | | 118/723 VE |
| 2015/0126044 A1* | 5/2015 | Kato | ............ | H01L 21/0228 |
| | | | | 118/723 R |
| 2015/0345015 A1* | 12/2015 | Chiba | ............ | C23C 16/45548 |
| | | | | 118/728 |
| 2016/0122872 A1* | 5/2016 | Kato | ............ | H01L 21/68764 |
| | | | | 118/712 |
| 2017/0125282 A1* | 5/2017 | Umehara | ............ | H01L 21/68771 |
| 2018/0051374 A1* | 2/2018 | Kato | ............ | C23C 16/345 |
| 2018/0073146 A1* | 3/2018 | Kato | ............ | H01J 37/321 |
| 2019/0382894 A1* | 12/2019 | Kato | ............ | C23C 16/45544 |
| 2020/0032390 A1* | 1/2020 | Kato | ............ | H01L 21/67748 |
| 2023/0402256 A1* | 12/2023 | Chiba | ............ | C23C 16/345 |

* cited by examiner

DEPOSITION METHOD AND DEPOSITION APPARATUS

CROSS-REFERENCE TO RELATED APPLICATIONS

The present application is based on and claims priority to Japanese Patent Application No. 2022-004618 filed on Jan. 14, 2022, the contents of which are incorporated herein by reference in their entirety.

BACKGROUND OF THE INVENTION

Field of the Invention

The present disclosure relates to a deposition method and a deposition apparatus.

Description of the Related Art

A technique is known in which thin films are subjected to annealing treatment together with plasma modification treatment (see, for example, Japanese Laid-Open Patent Publication No. 2014-22653).

SUMMARY OF THE INVENTION

According to one aspect of the present disclosure, a deposition apparatus includes: a processing chamber; a rotary table that is provided in the processing chamber and includes a substrate mounting region on which a substrate is mounted; a first processing region that is provided at a predetermined position in a circumferential direction of the rotary table and is a region in which a first process gas is supplied to the substrate mounting region; a second processing region that is provided downstream of the first processing region in the circumferential direction of the rotary table and is a region in which a second process gas that reacts with the first process gas is supplied to the substrate mounting region to generate a reaction product; a third processing region that is provided downstream of the second processing region in the circumferential direction of the rotary table and is a region in which a third process gas is activated and supplied to the substrate mounting region; a first heater that is provided above the rotary table in the second processing region and is configured to heat the substrate; and a plasma generator configured to activate the third process gas in the third processing region. The plasma generator includes: a protrusion having a longitudinally elongated shape in a planar view extending along a radius of the rotary table in a portion of an upper surface of the processing chamber, and protruding upward from the upper surface; and a coil that is wound along a side surface of the protrusion and has a longitudinally elongated shape in a planar view.

DESCRIPTION OF THE EMBODIMENTS

Figure 1:
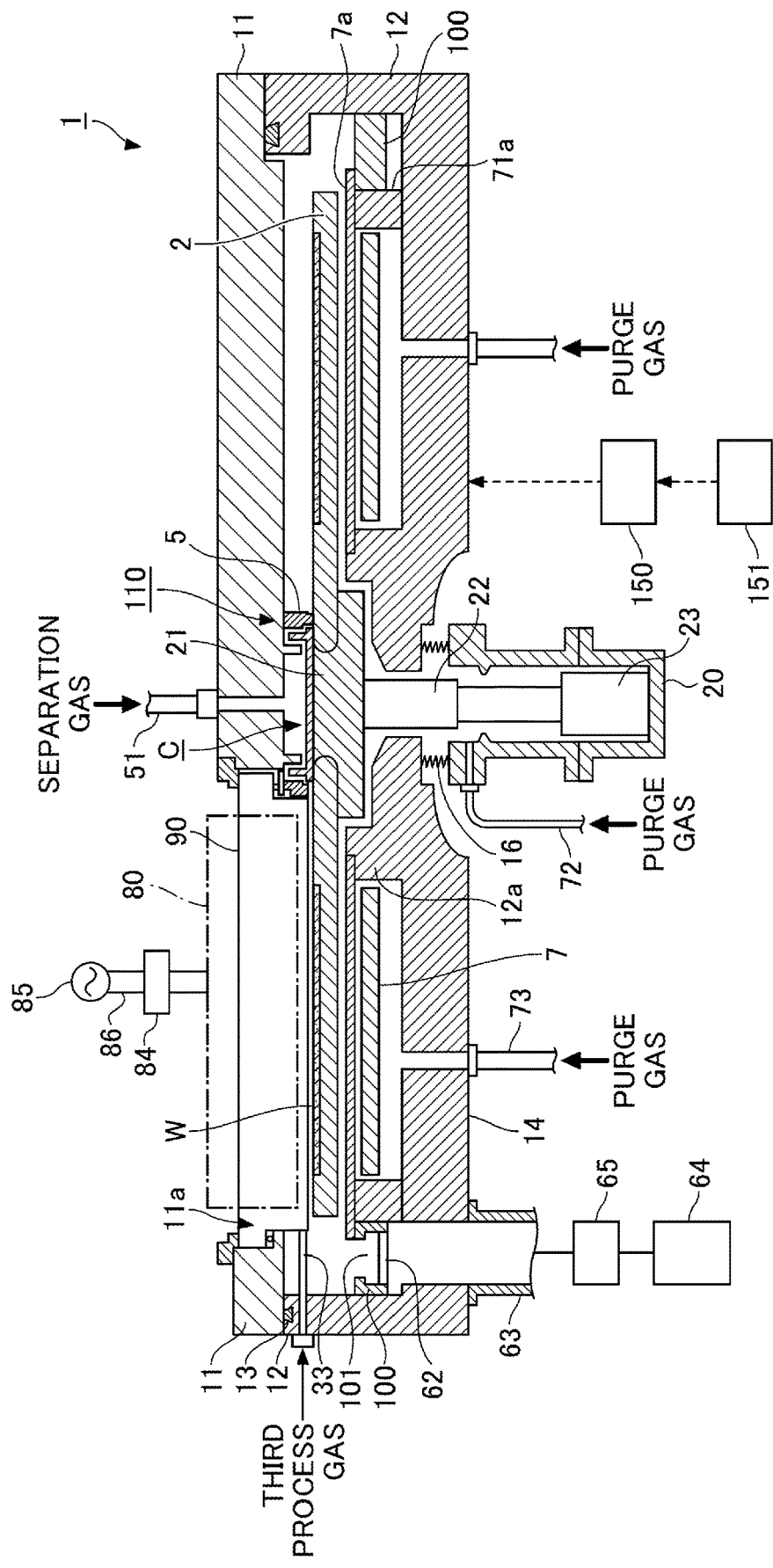
FIG. 1 is a schematic longitudinal cross-sectional view illustrating a deposition apparatus according to an embodiment.

Hereinafter, non-limiting exemplary embodiments of the present disclosure will be described with reference to the accompanying drawings. In all the accompanying drawings, the same or corresponding members or parts are denoted by the same or corresponding reference numerals, and overlapping descriptions are omitted.

[Film Deposition Apparatus]
(Overall Configuration)

Figure 2:
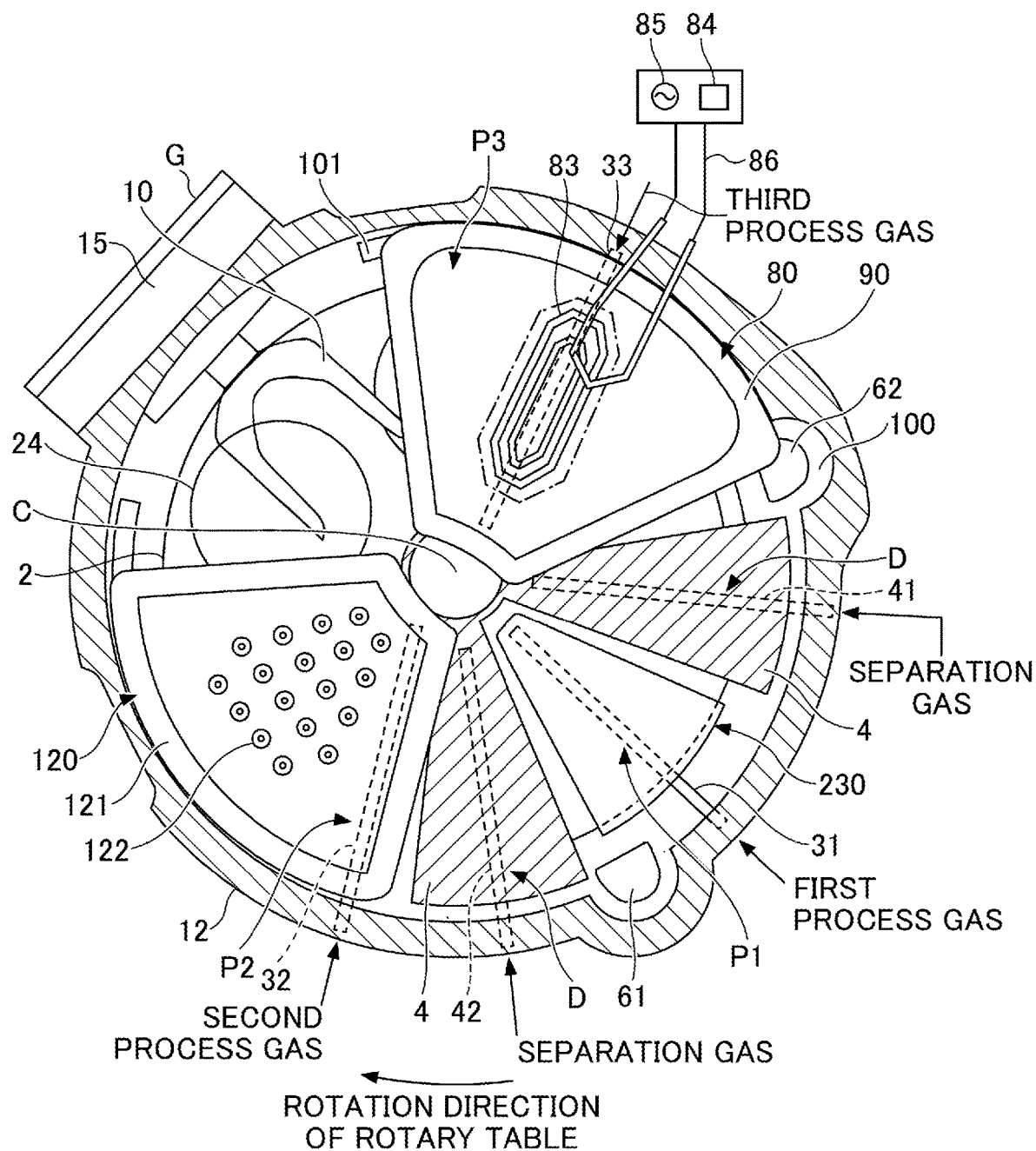
FIG. 2 is a schematic plan view illustrating the deposition apparatus according to the embodiment.
Figure 3:
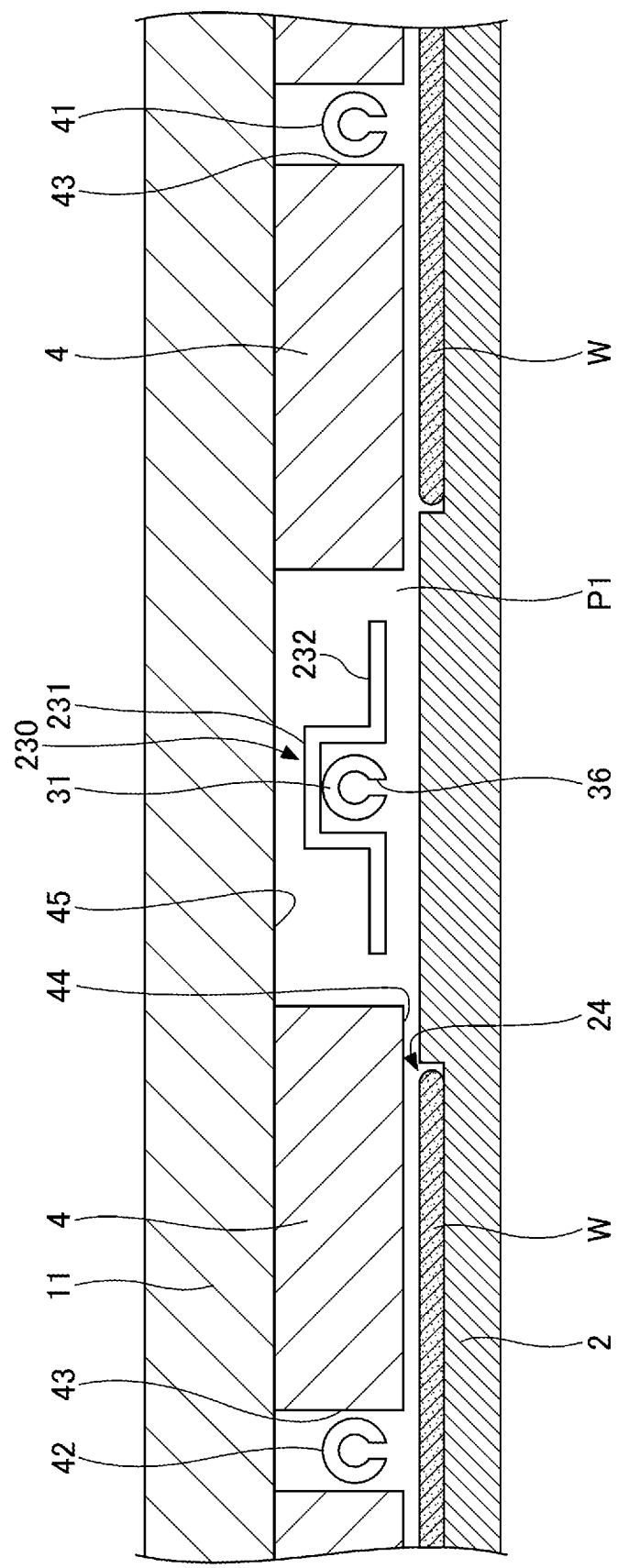
FIG. 3 is a cross-sectional view illustrating the deposition apparatus taken along a concentric circle of a rotary table according to the embodiment.

Referring to FIGS. 1 to 3, a deposition apparatus according to an embodiment will be described. FIG. 1 is a schematic longitudinal cross-sectional view illustrating a deposition apparatus according to an embodiment. FIG. 2 is a schematic plan view illustrating the deposition apparatus according to the embodiment. In FIG. 2, a top plate 11 is not illustrated for convenience of explanation. FIG. 3 is a cross-sectional view illustrating a plasma processing apparatus taken along a concentric circle of a rotary table 2 according to an embodiment. FIG. 3 illustrates a cross-section from one separation region D through a first processing region P1 to another separation region D.

The deposition apparatus according to an embodiment is configured as an apparatus that performs a deposition process on a plurality of (for example, five) substrates W at once. The substrate W is, for example, a semiconductor wafer. The deposition apparatus includes a vacuum vessel 1 and a rotary table 2.

The vacuum vessel 1 has a generally circular shape in a planar view. The vacuum vessel 1 is a processing chamber in which the substrate W is housed and a deposition process is performed on the substrate W. The vacuum vessel 1 includes a top plate 11 and a container body 12. The top plate 11 is provided at a position facing the upper surface of the rotary table 2. The top plate 11 is configured to be detachable from the container body 12. A seal member 13 having an annular shape is provided on the periphery of the upper surface of the container body 12. The seal member 13 is, for example, an O-ring.

A separation gas supply line 51 is connected to the central portion of the upper surface of the vacuum vessel 1. The separation gas supply line 51 supplies a separation gas to the central region C within the vacuum vessel 1. The separation gas prevents the different process gases from mixing together in the central region C in the vacuum vessel 1. The separation gas is, for example, an inert gas. Examples of the inert gas include argon gas and nitrogen gas. The outer circumference of the core section 21 of the bottom 14 of the vacuum vessel 1 is annularly formed to form a protrusion 12a in close proximity to the rotary table 2 from the lower side.

The rotary table 2 is provided in the vacuum vessel 1. The rotary table 2 has a rotation center at the center of the vacuum vessel 1. The rotary table 2 is fixed to a generally cylindrical core section 21 at the center. A drive section 23 is connected to the core section 21 via a vertically extending rotary shaft 22. The drive section 23 rotates the rotary table 2 around a vertical axis, for example, clockwise, via the rotary shaft 22 and the core section 21.

The rotary shaft 22 and the drive section 23 are housed in the case body 20. The case body 20 is hermetically attached to the lower surface of the bottom 14 of the vacuum vessel 1 via a bellows 16 at a flange on the upper surface side. A purge gas supply line 72 is connected to the case body 20. The purge gas supply line 72 supplies a purge gas to the area below the rotary table 2. The purge gas is, for example, an inert gas. The inert gas is, for example, argon gas and nitrogen gas.

A recessed portion 24 is formed on the surface of the rotary table 2. The recessed portion 24 has a circular shape in a planar view. The substrate W is mounted on the recessed portion 24. The recessed portion 24 functions as a substrate mounting region. The recessed portions 24 are provided at a plurality of points, for example, five points, along the rotation direction of the rotary table 2. The recessed portion 24 has an inner diameter slightly larger than the diameter of the substrate W. The recessed portion 24 has a depth approximately equal to or larger than the thickness of the substrate W. Therefore, when the substrate W is mounted on the recessed portion 24, the surface of the substrate W and the surface of the area of the rotary table 2 in which the substrate W is not mounted become the same height or the surface of the substrate W is lower than the surface of the rotary table 2. A plurality of (for example, three) through-holes are provided on the bottom of the recessed portion 24. A lift pin (not illustrated) is inserted into each through hole. The lift pin pushes the substrate W up and down from below.

The deposition apparatus has a first processing region P1, a second processing region P2, and a third processing region P3 (see FIG. 2). The first processing region P1, the second processing region P2, and the third processing region P3 are provided separately from each other along the rotation direction of the rotary table 2. A plurality (for example, five) of gas nozzles 31, 32, 33, 41, and 42 are disposed radially at intervals in the circumferential direction of the vacuum vessel 1, at a position facing the area through which the recessed portion 24 on the rotary table 2 passes. Each gas nozzle 31, 32, 33, 41, and 42 is formed, for example, of quartz. Each gas nozzle 31, 32, 33, 41, and 42 is disposed between the rotary table 2 and the top plate 11. Each gas nozzle 31, 32, 41, and 42 is attached, for example, so as to extend horizontally from the outer circumferential wall of the vacuum vessel 1 toward the central region C facing the substrate W. The gas nozzle 33 bends upward in the middle and then extends horizontally again. Details of the gas nozzle 33 will be described later. In the example illustrated in FIG. 2, the gas nozzle 33, the gas nozzle 41, the gas nozzle 31, the gas nozzle 42, and the gas nozzle 32 are arranged in this order clockwise from the transfer port 15 (rotation direction of the rotary table 2) which will be described later.

Each gas nozzle 31, 32, 33, 41, and 42 is connected to a respective gas source (not illustrated) via a flow control valve (not illustrated). Gas discharge holes 36 for discharging each gas are provided at a plurality of points along the radial direction of the rotary table 2 on the lower surface side of each gas nozzle 31, 32, 33, 41, and 42 (the side facing the rotary table 2) at equal intervals, for example. Each gas nozzle 31, 32, 33, 41, and 42 is provided so that the distance between the lower edge of each nozzle 31, 32, 33, 41, and 42 and the upper surface of the rotary table 2 is about 1 mm to 5 mm, for example.

The gas nozzle 31 is a first process gas nozzle that discharges a first process gas. The area below the gas nozzle 31 is a first processing region P1 for adsorbing the first process gas to the substrate W. The first process gas contains a silicon-containing gas. The silicon-containing gas is, for example, diisopropylaminosilane (DIPAS), trisdimethylaminosilane (3DMAS) gas, bistertial butylaminosilane (BT-BAS), dichlorosilane (DCS), and hexachlorodisilane (HCD).

The gas nozzle 32 is a second process gas nozzle that discharges the second process gas. The area below the gas nozzle 32 is a second processing region P2 for supplying the substrate W with a second process gas capable of reacting with the first process gas to generate a reaction product. The second process gas contains an oxidizing gas. Examples of the oxidizing gas include oxygen gas and ozone gas. The second process gas may contain an inert gas such as argon gas, nitrogen gas, and the like. A heater 120 is provided above the gas nozzle 32. The heater 120 heats the upper surface of the substrate W mounted on the recessed portion 24 of the rotary table 2. That is, the second processing region P2 also functions as a heating region for heating the substrate W. The gas nozzle 32 supplies the inert gas when heating the substrate W by the heater 120. Details of the heater 120 will be described later.

The gas nozzle 33 is a third process gas nozzle that discharges the third process gas. The area below the gas nozzle 33 is a third processing region P3 for plasma modification to the film on the substrate W. The third process gas, like the second process gas, contains the oxidizing gas. The third process gas may contain the inert gas. A plasma generator 80 is provided above the gas nozzle 33. The plasma generator 80 generates a plasma from the third process gas discharged by the gas nozzle 33. Details of the plasma generator 80 will be described later.

The gas nozzles 41 and 42 are separation gas nozzles that discharge the separation gas. The area below the gas nozzle 41 is the separation region D separating the third processing region P3 and the first processing region P1. The area below the gas nozzle 42 is the separation region D separating the first processing region P1 and the second processing region P2. The separation gas is, for example, an inert gas. The inert gas is, for example, argon gas and nitrogen gas.

An approximately fan-shaped projecting portion 4 is provided on the top plate 11 of the vacuum vessel 1 in the separation region D. The projecting portion 4 is attached to the back surface of the top plate 11. In the vacuum vessel 1, a flat low ceiling 44 (a first ceiling), which is the lower surface of the projecting portion 4, and a ceiling 45 (a second ceiling), which is formed on both sides of the ceiling 44 in the circumferential direction and is higher than the ceiling 44, are formed.

The projecting portion 4, which forms the ceiling 44, has a fan shape in a planar view with the apex of the fan shape being cut in an arc shape (see FIG. 2). In the projecting portion 4, a groove 43 is formed in the center of the circumferential direction, extending in the radial direction (see FIG. 3). In the grooves 43, the separation gas nozzles 41 and 42 are respectively accommodated. The periphery of the projecting portion 4 (the portion on the outer periphery side of the vacuum vessel 1) is bent in an L-shape so as to face the outer end surface of the rotary table 2 and be slightly spaced from the container body 12, in order to prevent mixing of the process gases.

A nozzle cover 230 is provided above the gas nozzle 31. The nozzle cover 230 includes a cover body 231 and rectifier plates 232 (see FIG. 3). The cover body 231 has a substantially box shape with an opening on the bottom to accommodate the gas nozzle 31. The rectifier plates 232 are formed of plates respectively connected to the open end on the bottom of the cover body 231 on the upstream side and downstream side in the rotation direction of the rotary table 2. The nozzle cover 230 allows the first process gas to flow along the substrate W. The nozzle cover 230 allows the separation gas to flow to the top plate 11 side of the vacuum vessel 1, avoiding the vicinity of the substrate W. The side wall of the cover body 231 at the rotation center side of the rotary table 2 extends toward the rotary table 2 so as to face the tip of the gas nozzle 31. The side wall of the cover body 231 at the outer periphery side of the rotary table 2 is opened so as not to interfere with the gas nozzle 31.

On the outer circumferential side of the rotary table 2, a side ring 100 as a cover body is disposed at a position slightly lower than the rotary table 2. On the upper surface of the side ring 100, exhaust ports 61 and 62 are formed, for example, at two points so as to be spaced apart from each other in the circumferential direction. In other words, two exhaust ports are formed in the floor of the vacuum vessel 1, and the exhaust ports 61 and 62 are formed in the side ring 100 at positions corresponding to the exhaust ports. In this embodiment, one of the exhaust ports 61 and 62 is referred to as a first exhaust port 61 and the other is referred to as a second exhaust port 62.

The first exhaust port 61 is formed at a position closer to the separation region D, between the gas nozzle 31 and the separation region D located downstream of the gas nozzle 31 in the rotation direction of the rotary table 2. The second exhaust port 62 is formed at a position closer to the separation region D, between the plasma generator 80 and the separation region D located downstream of the plasma generator 80 in the rotation direction of the rotary table 2.

The first exhaust port 61 evacuates the first process gas, the separation gas, and the like. The second exhaust port 62 evacuates the third process gas, the separation gas, and the like. The first exhaust port 61 and the second exhaust port 62 are each connected to an exhaust device 64 such as a vacuum pump, by an exhaust pipe 63, which is interposed with a pressure regulator 65 such as a butterfly valve.

Because the housing 90, which will be described later, is disposed from the central region C to the outer edge, the gas that flows from from the upstream of the third processing region P3 in the rotation direction of the rotary table 2 may be restricted from flowing toward the second exhaust port 62 by the housing 90. Therefore, a groove-shaped gas flow passage 101 for flowing gas is formed on the upper surface of the side ring 100 on the outer circumferential side of the housing 90.

The central portion of the lower surface of the top plate 11 is provided with a protrusion 5 that is formed in a substantially annular shape in a circumferential direction contiguously with a portion of the central region C-side of the projecting portion 4, and is formed such that the lower surface thereof is at the same height as the lower surface of the projecting portion 4 (the ceiling 44). On the upper side of the core section 21 closer to the rotation center of the rotary table 2 than to the protrusion 5, a labyrinth structure 110 is provided for preventing various types of gases from mixing with each other in the central region C.

The housing 90 is formed up to a position close to the central region C. For this reason, the core section 21 supporting the central portion of the rotary table 2 is formed such that the portion above the rotary table 2 is formed at the rotation center side so as to avoid the housing 90. Therefore, on the central region C side, various types of gases are more likely to mix with each other than on the outer edge side. Accordingly, by forming the labyrinth structure above the core section 21, it is possible to obtain a longer gas flow passage and prevent mixing of the gases.

A heater unit 7 is provided in the space between the rotary table 2 and the bottom 14 of the vacuum vessel 1. The heater unit 7 is configured so that the substrate W on the rotary table 2 can be heated to, for example, room temperature to approximately 850° C. via the rotary table 2. A cover member 71a is provided on the lateral side of the heater unit 7, and a cover member 7a is provided to cover the upper side of the heater unit 7. A purge gas supply line 73 is provided on the bottom 14 of the vacuum vessel 1. The purge gas supply line 73 is provided at a plurality of points throughout the circumferential direction. The purge gas supply line 73 supplies the purge gas to the space of the heater unit 7 from below the heater unit 7, and purges the space.

On the side wall of the vacuum vessel 1, a transfer port 15 is formed between a transfer arm 10 and the rotary table 2, for transferring the substrate W (see FIG. 2). The transfer port 15 is configured to be hermetically opened and closed by a gate valve G. The substrate W mounted on the recessed portion 24 of the rotary table 2 is transferred to and from the transfer arm 10, at a position facing the transfer port 15.

The deposition apparatus includes a controller 150. The controller 150 is, for example, a computer and controls the operation of the entire apparatus. A program for performing the deposition method described later is stored in the memory of the controller 150. The program is installed in the controller 150 from the storage unit 151 which is a storage medium such as a flash memory, a hard disk, a compact disk, an optical disk, a memory card, a flexible disk, and the like.

(Heater)

Figure 4:
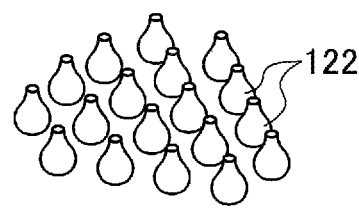
FIG. 4 is an exploded perspective view illustrating a configuration of a heater.
Figure 4:
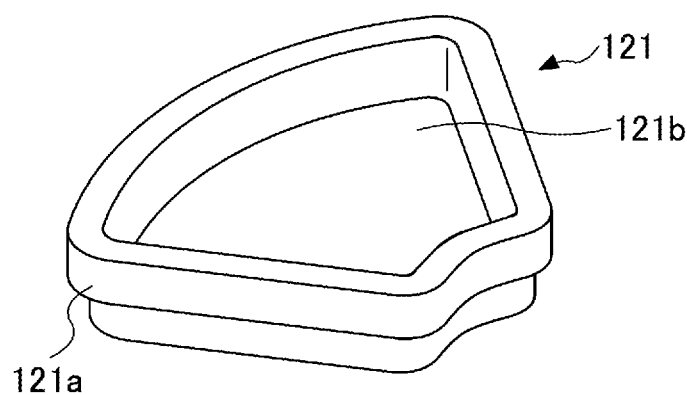
Figure 4:
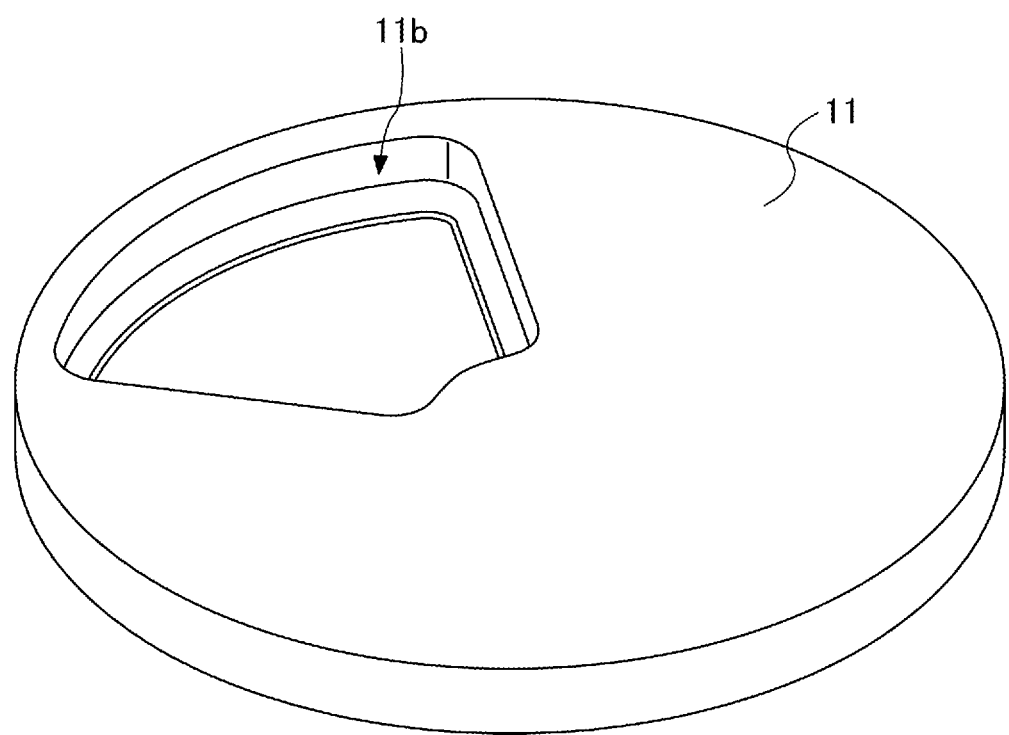

Referring to FIG. 4, an example of the heater 120 provided by a deposition apparatus according to an embodiment will be described. FIG. 4 illustrates an exploded perspective view of the configuration of the heater 120.

As illustrated in FIG. 4, the heater 120 includes a transparent member 121 and a plurality of heating lamps 122.

The transparent member 121 has a flange 121a and a window 121b. The flange 121a is disposed on a step 11b of the top plate 11. By inserting the flange 121a into the step 11b of the top plate 11, the flange 121a and the step 11b are engaged with each other. A seal member is disposed on the step 11b. The seal member hermetically connects the step 11b and the transparent member 121. The seal member is, for example, an O-ring. The transparent member 121 is fixed to the top plate 11 with a fastening member (not illustrated) such as a bolt. This ensures the airtightness inside the vacuum vessel 1. The window 121b is fitted with a member formed of a material (for example, quartz) that transmits light (for example, infrared light).

The heating lamps 122 are disposed in an approximately fan shape, above the transparent member 121. The heating lamps 122 heat the upper surface of the substrate W mounted on the recessed portion 24 and located in the second processing region P2, by irradiating light in the absorption wavelength region of the substrate W, such as infrared light. The heating lamps 122 are controlled by the controller 150 so as not to generate an in-plane temperature difference in the substrate W. The number and arrangement of the heating lamps 122 is not particularly limited. Preferably, the heating lamps 122 are capable of selectively heating only the substrate W. As a result, members of the apparatus around the substrate W are not heated.

(Plasma Generator)

Figure 5:
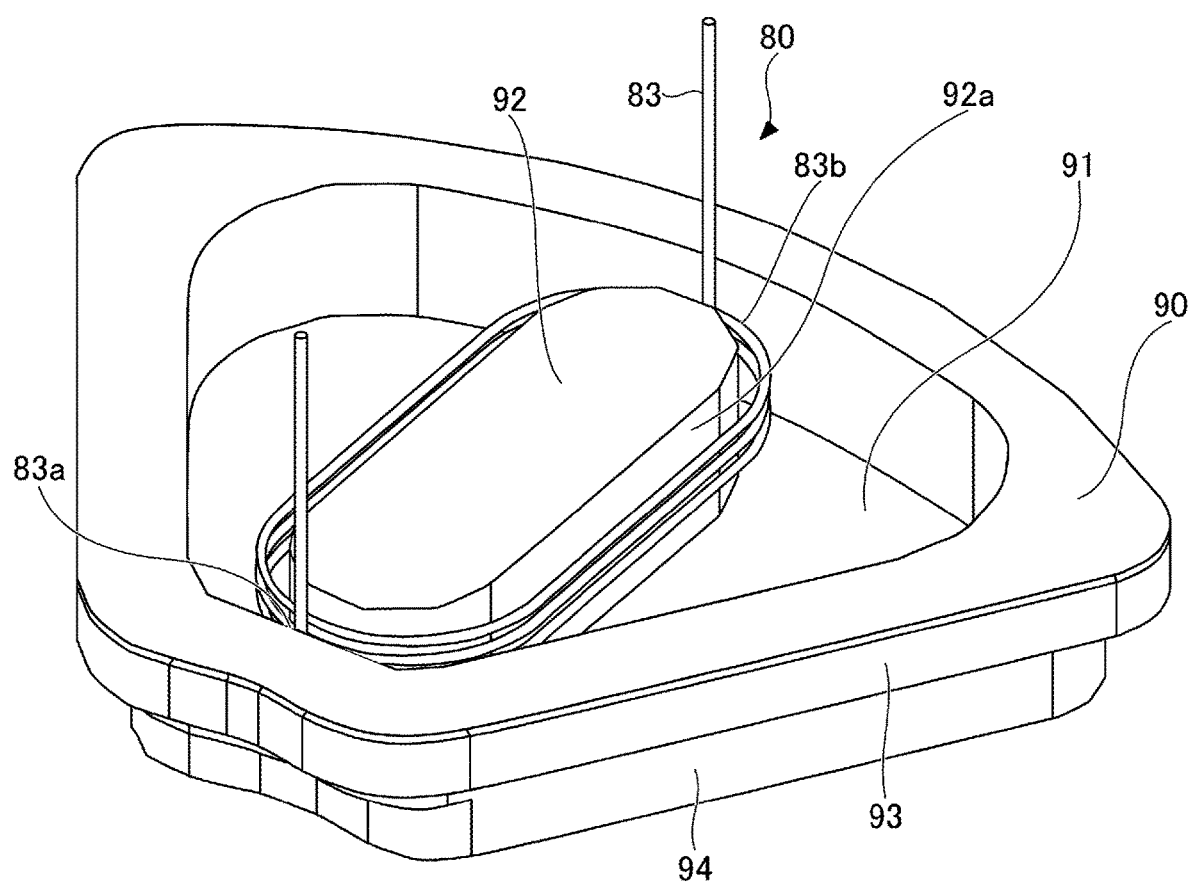
FIG. 5 is a diagram illustrating a main part of a plasma generator.
Figure 6:
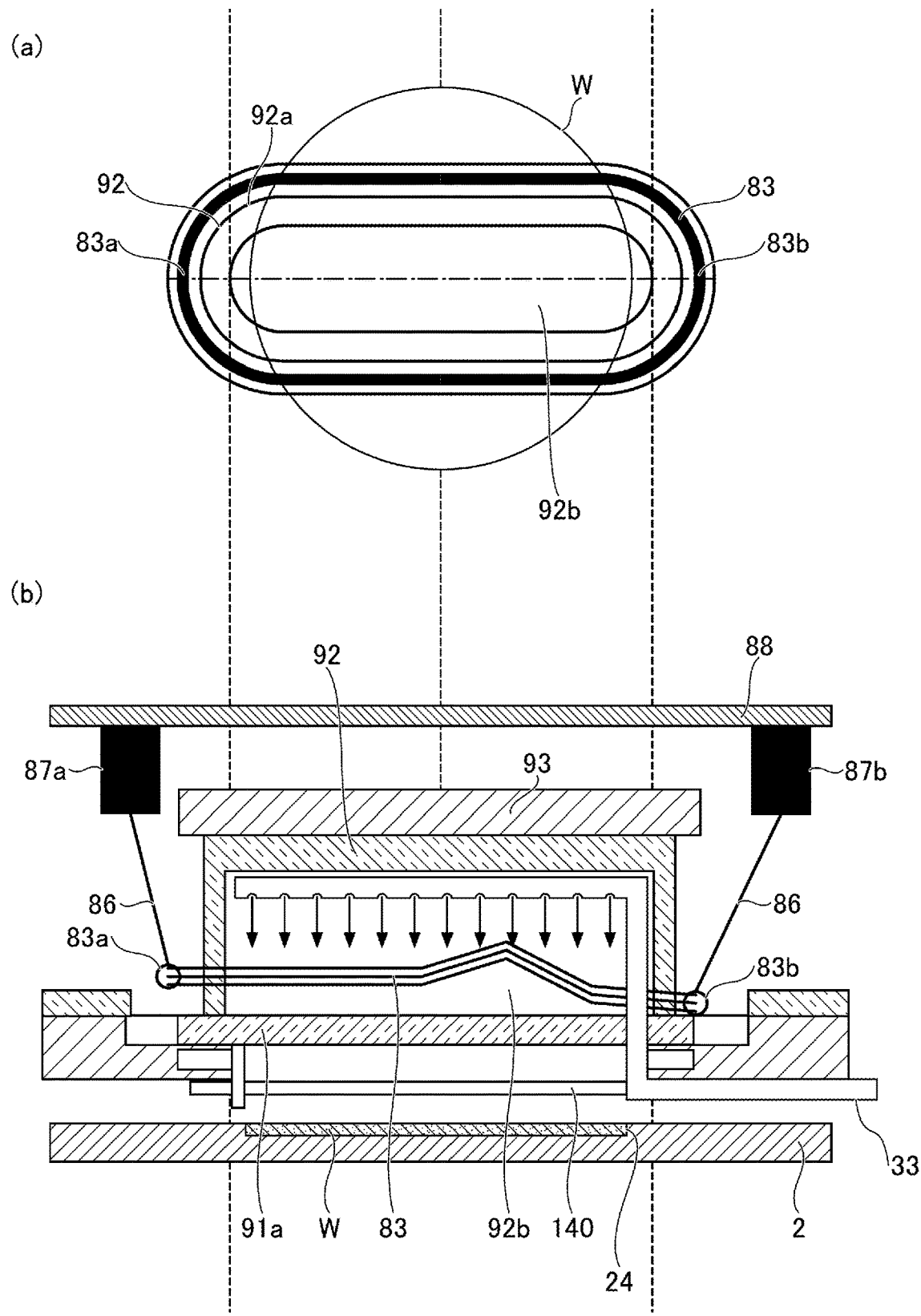
FIG. 6 is a diagram illustrating a configuration of the plasma generator.
Figure 7:
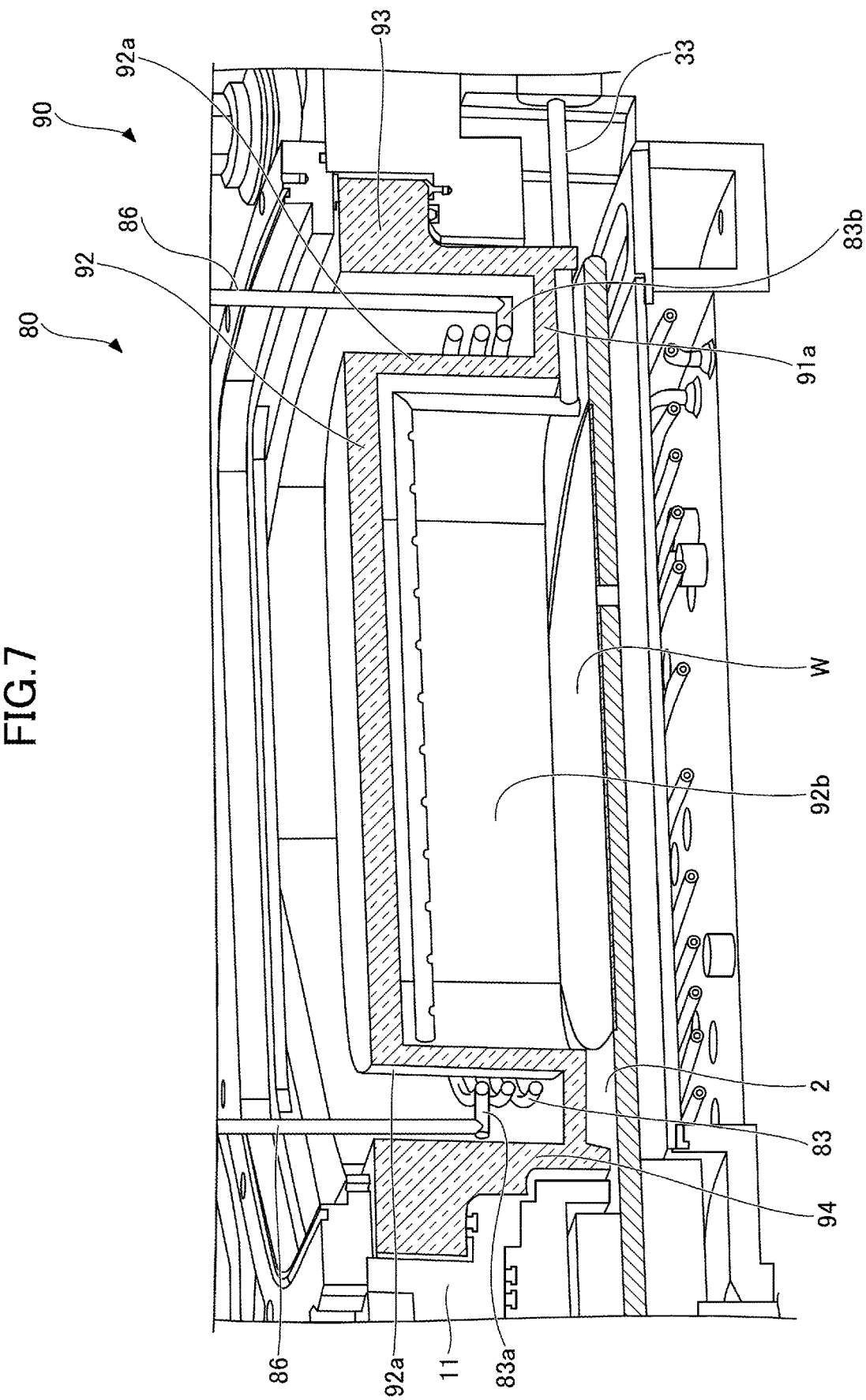
FIG. 7 is a detailed view illustrating a configuration around a protrusion of a housing of the plasma generator.

Referring to FIGS. 5 to 7, an example of the plasma generator 80 included in the deposition apparatus according to an embodiment will be described. FIG. 5 is a diagram illustrating a main part of the plasma generator 80.

As illustrated in FIG. 5, the plasma generator 80 includes a coil 83 and a housing 90.

The housing 90 is provided by fitting into the step 11a of the top plate 11 of the vacuum vessel 1, and constitutes a portion of the upper surface of the vacuum vessel 1 (see FIG. 1).

The housing 90 has a depression 91, a protrusion 92, a flange 93, and a lower protrusion 94. The protrusion 92 protrudes from a bottom 91a of the depression 91. The interior of the protrusion 92 is a cavity and constitutes a plasma generating chamber 92b, which will be described later. The protrusion 92 has a longitudinal shape extending in one direction. The protrusion 92 may be configured, for example, as an elongated polygon. In FIG. 5, the protrusion 92 is configured as a dodecagon in a planar view, but it can be configured in various shapes as long as it has four or more sides. In addition to the polygonal shape, it may be formed such that both ends are shaped in an arc shape such as a semicircle. The step difference between the flange 93 and the lower protrusion 94 functions as an engagement portion when the housing 90 is fitted into the step 11a of the top plate 11 of the vacuum vessel 1.

The housing 90 may be made of various materials, but may be made of quartz, for example. Because the top plate 11 of the vacuum vessel 1 is also made of quartz, the housing 90 that forms a part of the top plate 11 is also preferably made of quartz.

The coil 83 functions as an electromagnetic field generator for generating an electromagnetic field by applying alternating current power. The coil 83 is wound along a side surface 92a of the protrusion 92. The coil 83 may be wound as many times as needed around the protrusion 92, but may be wound three times, for example, as illustrated in FIG. 5. Longitudinal end portions 83a and 83b of the coil 83 are pulled upwardly.

The coil 83 is connected to a high frequency power supply 85 via a matcher 84 (see FIGS. 1 and 2). The high frequency power supply 85 is an RF power supply having, for example, a frequency of 13.56 MHz and an output power of 5000 W. The coil 83 is provided so as to be hermetically separated from the inner region of the vacuum vessel 1. The coil 83, the matcher 84, and the high frequency power supply 85 are electrically connected by a connection electrode 86.

In FIG. 5, the end portion 83a of the coil 83, which is located on the apex side of the fan shape of the housing 90, is at the center side of the rotary table 2, and the opposite end portion 83b is at the outer circumferential side of the rotary table 2. The longitudinally extending portion of the coil 83 wound along the side surface of the protrusion 92 is provided to entirely cover the recessed portion 24 in the radial direction of the rotary table 2.

The end portions 83a and 83b of the coil 83 are connected to lifting mechanisms and are each configured to be capable of vertical movement independently, although the details will be described later. Accordingly, the coil 83 can be inclined in the radial direction of the rotary table 2. As a result, it is possible to correct the imbalance in which, when the coil 83 is placed horizontally, the plasma processing amount on the center side is larger than the plasma processing amount on the outer circumferential side due to the influence of the inner ring difference of the rotary table 2. That is, the end portion 83a on the center side is pulled up so that the distance from the rotary table 2 is larger than the distance between the end portion 83b on the outer circumferential side and the rotary table 2, thereby weakening the plasma processing amount on the center side and correcting the imbalance of the plasma processing amount between the center side and the outer circumferential side.

FIG. 6 is a cross-sectional view illustrating a configuration of the plasma generator 80. FIG. 6(a) is a top view of the plasma generator 80, and FIG. 6(b) is a side cross-sectional view of the plasma generator 80.

As illustrated in FIG. 6(a), the coil 83 has a length that is enough to cover the substrate W in the radial direction of the rotary table 2. Therefore, the side surface 92a in the longitudinal direction of the protrusion 92 of the housing 90 is provided to be longer than the diameter of the substrate W.

As illustrated in FIG. 6(b), the inside of the protrusion 92 constitutes a plasma generating chamber 92b. The plasma generating chamber 92b is supplied with the third process gas downwardly from the gas nozzle 33 provided near the ceiling, and the third process gas is activated by the coil 83. The plasma generating chamber 92b is located near the coil 83. Thus, in the plasma generating chamber 92b, plasma is efficiently generated from the third process gas discharged by the gas nozzle 33. In other words, active species such as radicals are efficiently generated in the plasma generating chamber 92b.

The end portions 83a and 83b of the coil 83 are connected to independent lifting mechanisms 87a and 87b, respectively, via the connection electrode 86. The lifting mechanisms 87a and 87b may include motors and the like to move the end portions 83a and 83b of the coil 83 up and down to incline the coil 83. The lifting mechanisms 87a and 87b are supported, for example, by a support member 88. The lifting mechanisms 87a and 87b may be configured integrally. The lifting mechanisms 87a and 87b may have various configurations as long as they can independently move the end portions 83a and 83b of the coil 83 up and down.

In the vacuum vessel 1, an ion trap plate 140 may be provided, as necessary, to control the amount of ions generated in the plasma generating chamber 92b. The ion trap plate 140 is also provided to correct the difference in the plasma processing amount between the center side and the outer circumferential side of the rotary table 2, and adjusts the amount of ions reaching the substrate W by covering more towards the center side of the rotary table 2. The ion trap plate 140 is not essential and may be provided as required.

FIG. 7 is a detailed view illustrating a configuration around the protrusion 92 of the housing 90 of the plasma generator 80. As illustrated in FIG. 7, the flange 93 of the housing 90 engages an opening in the top plate 11 of the vacuum vessel 1 and fits into the top plate 11. The lower protrusion 94 defines the third processing region P3 for performing plasma processing. The bottom of the plasma generating chamber 92b within the protrusion 92 of the housing 90 is open so that the third process gas supplied from the gas nozzle 33 is supplied to the substrate W. At this time, the coil 83 is wound around the lower portion of the side surface 92a of the protrusion 92, so that electromagnetic waves are generated by supplying AC power, and the third process gas is plasmatized (ionized) or radicalized by the electromagnetic wave energy. The plasmatized third process gas is supplied to the substrate W, and the film on the substrate W is modified.

The end portion 83a on the center side and the end portion 83b on the outer circumferential side of the coil 83 are configured to move up and down via the connection electrode 86. By inclining the coil 83, the plasma processing amount can be adjusted. For example, the end portion 83a on the center side of the coil 83 is raised to reduce the plasma processing amount on the center side, thereby equalizing the amount with the outer circumferential side. The vertical movement distance of the end portions 83a and 83b may be set to various distances depending on the application, but may be set to allow vertical movement of 150 to 200 mm, for example.

As illustrated in FIG. 7, the plasma generator 80 does not have a Faraday shield. Conventionally, a Faraday shield is provided between the coil 83 and the bottom 91a of the housing 90 so that the electric field component is cut and only the magnetic field component is supplied to the substrate W. However, because the Faraday shield is formed of metal, there has been a problem that it cannot be used when the high temperature process is 650° C. or more.

In the plasma generator 80 according to the embodiment, a metal Faraday shield is not included, and the main part of the plasma generator 80 is composed only of highly heat-resistant quartz components. This allows for higher process temperatures (for example, 650° C. or more and 850° C. or less). Thus, according to the plasma generator 80 according to the embodiment, the plasma processing amount in the radial direction can be adjusted and equalized, while enabling the high temperature process.

<Deposition Method>

Figure 8:
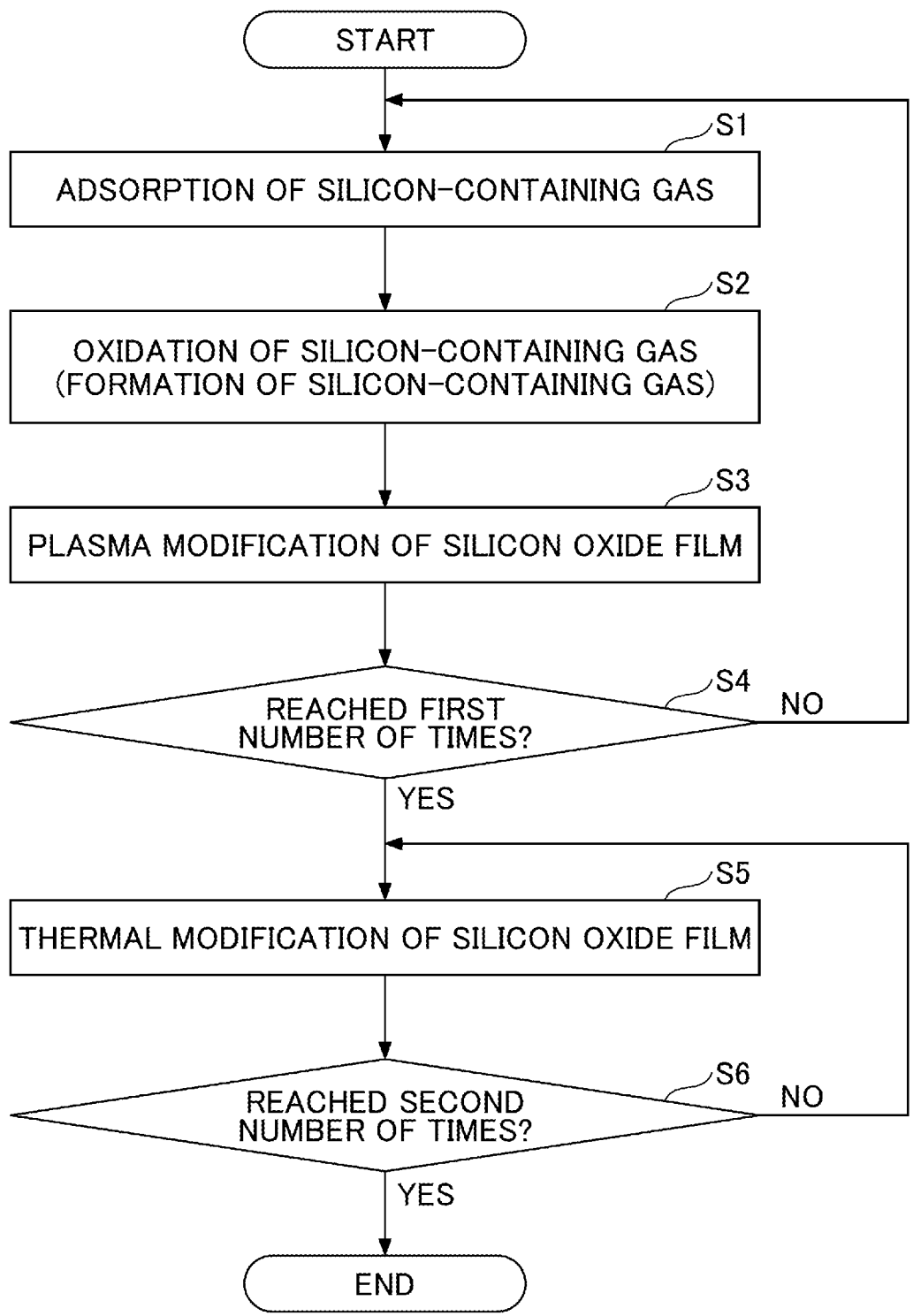
FIG. 8 is a flowchart illustrating a deposition method according to an embodiment.

Referring to FIG. 8, an operation of the deposition apparatus according to the embodiment, that is, an example of a deposition method will be described. Hereinafter, a case where a silicon oxide film is deposited on the substrate W will be described. The deposition method according to the embodiment is performed by controlling each part of the deposition apparatus by the controller 150.

First, the coil 83 is set to a predetermined inclination depending on the process. The inclination angle of the coil 83 may be determined, for example, by a recipe in which the state of the coil 83 is designated. The controller 150 may make a determination based on the recipe and set the coil 83 to a predetermined inclination angle. The inclination angle of the coil 83 may be set automatically by the lifting mechanisms 87a and 87b, or may be set by an operator.

Next, the substrate W is transferred into the vacuum vessel 1. Specifically, first, the gate valve G is opened. Next, while the rotary table 2 is intermittently rotated, the substrate W is mounted on the rotary table 2 through the transfer port 15 by the transfer arm 10.

Next, the gate valve G is closed, and the substrate W is heated by the heater unit 7 to a predetermined temperature (for example, 650° C. or more and 850° C. or less) while the rotary table 2 is rotated under the condition that the inside of the vacuum vessel 1 is kept at a predetermined pressure by the exhaust device 64 and the pressure regulator 65. At this time, the separation gas, for example, Ar gas, is supplied from the separation gas nozzles 41 and 42.

Next, the first process gas, the second process gas, and the third process gas are supplied from the gas nozzle 31, the gas nozzle 32, and the gas nozzle 33, respectively. The first process gas, the second process gas, and the third process gas may be various gases depending on the application, but for example, the first process gas is a silicon-containing gas, the second process gas is oxygen gas, and the third process gas is a mixture of oxygen gas and argon gas.

On the surface of the substrate W, the silicon-containing gas is absorbed in the first processing region P1 by rotation of the rotary table 2 (step S1 of FIG. 8). Then, the silicon-containing gas adsorbed on the substrate W in the second processing region P2 is oxidized by the oxygen gas (step S2 of FIG. 8). As a result, one or a plurality of molecular layers of the silicon oxide film, which is a thin film component, is formed to form a reaction product.

When the rotary table 2 is rotated further, the substrate W reaches the third processing region P3 and the silicon oxide film is modified by plasma processing (step S3 of FIG. 8). In the modifying process, the coil 83 of the plasma generator 80 is set to be inclined for performing plasma processing with high in-plane uniformity, so that plasma processing with high in-plane uniformity can be performed. When plasma processing is performed in the third processing region P3, the plasma generator 80 supplies the coil 83 with high frequency power of a predetermined output.

In the embodiment, the rotary table 2 is continuously rotated a first number of times (step S4 in FIG. 8). As a result, adsorption of the silicon-containing gas on the surface of the substrate W, oxidation of the silicon-containing gas adsorbed on the surface of the substrate W, and plasma modification of the silicon oxide film are repeated in this order. That is, the deposition process by the atomic layer deposition (ALD) method and the plasma modification of the formed film are repeated a first number of times by rotation of the rotary table 2.

The separation region D is provided along the circumferential direction of the rotary table 2 between the first processing region P1 and the second processing region P2 of the deposition apparatus according to the embodiment. Therefore, while the mixing of the first process gas and the second process gas is inhibited by the separation region D, the gases are evacuated toward the exhaust ports 61 and 62. The separation region D is provided along the circumferential direction of the rotary table 2 between the third processing region P3 and the first processing region P1 of the deposition apparatus according to the embodiment. Therefore, while the mixing of the third process gas and the first process gas is inhibited by the separation region D, the gases are evacuated toward the exhaust ports 61 and 62.

Next, the supply of the first process gas from the gas nozzle 31 is stopped, the supply of the second process gas from the gas nozzle 32 is stopped, and the supply of the third process gas from the gas nozzle 33 is stopped. Inert gas is supplied from the gas nozzle 32. The inert gas may be, for example, argon gas and nitrogen gas. The inert gas may be supplied from the gas nozzle 31 and the gas nozzle 32.

In this state, the controller 150 rotates the rotary table 2 until one of the substrates W mounted on the rotary table 2 is located below the heating lamps 122. The controller 150 operates the heating lamps 122 to heat the substrate W located below the heating lamps 122 to a predetermined temperature (for example, 750° C. or more and 900° C. or less). The controller 150 stops the rotary table 2 for a predetermined period of time (for example, 60 seconds to 180 seconds) with the substrate W located below the heating lamps 122 and the heating lamps 122 in operation. As a result, the silicon oxide film deposited on the substrate W located below the heating lamps 122 is thermally modified (step S5 of FIG. 8).

Next, the controller 150 rotates the rotary table 2 until another substrate W adjacent to the substrate W located below the heating lamps 122 comes below the heating lamps 122. The controller 150 operates the heating lamps 122 to heat the substrate W located below the heating lamps 122 to a predetermined temperature (for example, 750° C. or more and 900° C. or less). The controller 150 stops the rotary table 2 for a predetermined period of time (for example, 60 seconds to 180 seconds) with the substrate W located below the heating lamps 122 and the heating lamps 122 in operation. As a result, the silicon oxide film deposited on the substrate W located below the heating lamps 122 is thermally modified.

The controller 150 moves the plurality of substrates W sequentially to a position below the heating lamps 122 by intermittently rotating the rotary table 2. Thus, for all of the plurality of substrates W, the silicon oxide films deposited on the substrates W are thermally modified.

In the embodiment, thermal modification of the silicon oxide film deposited on the substrate W is repeated by intermittently rotating the rotary table 2 a second number of times (for example, five to six times) (step S6 in FIG. 8).

When forming a silicon oxide film in a recessed portion such as a trench, a hole, or the like formed on the surface of the substrate W, in plasma modification of the silicon oxide film, it tends to be difficult for active species such as ions, radicals, or the like contained in the plasma to reach deep positions in the recessed portion. For this reason, the silicon oxide film deposited in deep positions of the recessed portion is harder to be modified than the silicon oxide film deposited in shallow positions of the recessed portion. As a result, the film quality of the silicon oxide film varies in the depth direction of the recessed portion.

In the deposition method according to the embodiment, plasma modification is performed on the silicon oxide film, and then thermal modification is performed on the plasma-modified silicon oxide film by the heater 120. As a result, because new bonds are generated between atoms by thermal energy while the atoms activated by the plasma modification are moved, the silicon oxide film is modified into a high-quality film. In addition, because the entire substrate W is heated when the substrate W is heated by the heater 120, it is possible to modify the silicon oxide film deposited in deep positions in the recessed portion, which is difficult to be modified by plasma modification. For this reason, the film quality of the silicon oxide film deposited at deep positions of the recessed portion can be brought closer to the film quality of the silicon oxide film deposited at shallow positions of the recessed portion. Therefore, it is possible to improve the uniformity of the film quality of the silicon oxide film in the depth direction of the recessed portion. That is, the silicon oxide film of good film quality can be formed over the depth direction of the recessed portion.

The embodiments disclosed herein should be considered to be exemplary in all respects and not limiting. The above embodiments may be omitted, substituted, or modified in various forms without departing from the appended claims and spirit thereof.

According to the present disclosure, a film of good film quality can be formed over the depth direction of the recessed portion.

What is claimed is:

1. A deposition method comprising:
adsorbing, in a first processing region provided at a predetermined position in a circumferential direction of a rotary table provided in a processing chamber, a first process gas to a surface of a substrate mounted on the rotary table;
rotating the rotary table and supplying a second process gas that reacts with the first process gas and generates a reaction product on the surface of the substrate to which the first process gas is adsorbed, in a second processing region that is provided downstream of the first processing region in the circumferential direction of the rotary table, thereby depositing the reaction product on the surface of the substrate;
rotating the rotary table, activating a third process gas by a plasma generator that is provided downstream of the second processing region in the circumferential direction of the rotary table, and supplying the third process gas to the substrate, thereby performing plasma modification on the reaction product; and
rotating the rotary table and heating the substrate using a first heater that is provided above the rotary table in the second processing region, thereby performing thermal modification on the plasma-modified reaction product,
wherein the plasma generator includes:
a protrusion having a longitudinally elongated shape in a planar view extending along a radius of the rotary table in a portion of an upper surface of the processing chamber, and protruding upward from the upper surface; and
a coil that is wound along a side surface of the protrusion and that has a longitudinally elongated shape in a planar view.

2. The deposition method according to claim 1, wherein the heating of the substrate is performed after repeating a first cycle multiple times, the first cycle including the adsorbing of the first process gas, the depositing of the reaction product, and the supplying of the third process gas.

3. The deposition method according to claim 2, wherein the first cycle is performed with heating of the substrate to a temperature of 650° C. to 850° C.

4. The deposition method according to claim 3, wherein a second cycle including the first cycle and the heating of the substrate is repeated multiple times.

5. The deposition method according to claim 4, wherein the first cycle is performed while rotating the rotary table continuously, and the heating of the substrate is performed while rotating the rotary table intermittently.

6. The deposition method according to claim 3, wherein the first cycle is performed while rotating the rotary table continuously, and the heating of the substrate is performed while rotating the rotary table intermittently.

7. The deposition method according to claim 2, wherein a second cycle including the first cycle and the heating of the substrate is repeated multiple times.

8. The deposition method according to claim 7, wherein the first cycle is performed while rotating the rotary table continuously, and the heating of the substrate is performed while rotating the rotary table intermittently.

9. The deposition method according to claim 2, wherein the first cycle is performed while rotating the rotary table continuously, and the heating of the substrate is performed while rotating the rotary table intermittently.

* * * * *